US012794414B2

(12) United States Patent
Tseng

(10) Patent No.: US 12,794,414 B2
(45) Date of Patent: Nov. 10, 2026

(54) OSCILLATOR DEVICE

(71) Applicant: Nuvoton Technology Corporation, Hsinchu Science Park (TW)

(72) Inventor: Hua-Chun Tseng, Jhubei City (TW)

(73) Assignee: Nuvoton Technology Corporation, Hsinchu Science Park (TW)

( * ) Notice: Subject to any disclaimer, the term of this patent is extended or adjusted under 35 U.S.C. 154(b) by 0 days.

(21) Appl. No.: 18/964,787

(22) Filed: Dec. 2, 2024

(65) Prior Publication Data

US 2026/0019034 A1 Jan. 15, 2026

(30) Foreign Application Priority Data

Jul. 10, 2024 (TW) ................................ 113125754

(51) Int. Cl.
*H03K 3/023* (2006.01)
*H03B 5/04* (2006.01)

(52) U.S. Cl.
CPC ....... *H03B 5/04* (2013.01); *H03B 2200/0036* (2013.01)

(58) Field of Classification Search
CPC ................................ H03B 5/04; H03K 3/023
USPC .................................................. 331/18, 111
See application file for complete search history.

(56) References Cited

U.S. PATENT DOCUMENTS 5,481,227 A * 1/1996 Komori .................... H03L 7/00 455/337
5,786,726 A * 7/1998 Lemasson ........... H03B 5/1209 455/337
8,350,631 B1 * 1/2013 Wadhwa ............... H03K 4/502 331/111
2012/0081188 A1 * 4/2012 Liu ........................ H03L 7/104 438/379
2013/0027097 A1 1/2013 Wang et al.
2021/0013833 A1 1/2021 Chakraborty

FOREIGN PATENT DOCUMENTS

EP 1090455 B1 6/2005
TW I396386 B 5/2013

OTHER PUBLICATIONS

Office Action for TW Application No. 113125754 dated Apr. 23, 2025 is attached (10 pages).

* cited by examiner

*Primary Examiner* — Joseph Chang
(74) *Attorney, Agent, or Firm* — MUNCY, GEISSLER, OLDS & LOWE, P.C.

(57) ABSTRACT

An oscillator device includes a control circuit and an oscillator circuit. The control circuit receives a first input signal and a second input signal, and generates a first control signal and a second control signal. The oscillator circuit is coupled to the control circuit. The oscillator circuit receives the first control signal and the second control signal, and generates a first oscillating signal and a second oscillating signal according to the first control signal and the second control signal.

10 Claims, 3 Drawing Sheets

OSCILLATOR DEVICE

CROSS REFERENCE TO RELATED APPLICATIONS

This application claims priority of Taiwan Patent Application No. 113125754, filed on Jul. 10, 2024, the entirety of which is incorporated by reference herein.

BACKGROUND OF THE INVENTION

Field of the Invention

The present invention relates to an oscillator, and in particular it relates to an oscillator device for outputting oscillating signals with the same frequency or different frequencies.

Description of the Related Art

An oscillator generally adjusts the bias current of the oscillator's oscillation stage by using the control voltage to adjust the oscillation frequency. However, since the control voltage is limited by the operating range, when the control voltage is lower than the lower limit of the operating range, the oscillator may not generate the bias current. At this time, because there is no bias current, the bias current of the oscillator comes from the leakage of the components, so it may be that the output frequency of the oscillator cannot be controlled. In addition, when the control voltage is higher than the upper limit of the operating range, it may be that the oscillation frequency of the oscillator cannot be increased, which is the highest frequency that the oscillator may output.

Furthermore, when the oscillator operates at the high frequency, the operating current of the oscillator is usually much greater than the current when operating at low frequency. In addition, when considering low-power operating scenarios, it is hoped that the current of the analog circuit of the oscillator will not change too much due to the different output frequencies. Therefore, a new design is needed to solve the problem described above.

BRIEF SUMMARY OF THE INVENTION

An embodiment of the present invention provides an oscillator device, the oscillator circuit may simultaneously output two oscillating signals with the same frequency or different frequencies by changing the magnitude of the input signal, so that there is no need to worry about the usage restrictions of the input signal, and there is also no need to implement any monitoring circuit or prevention mechanism for the input signal.

An embodiment of the present invention provides an oscillator device, which includes a control circuit and an oscillator circuit. The control circuit is configured to receive a first input signal and a second input signal, and generate a first control signal and a second control signal. The oscillator circuit is coupled to the control circuit, and configured to receive the first control signal and the second control signal, and generate a first oscillating signal and a second oscillating signal according to the first control signal and the second control signal.

According to the oscillator device disclosed by the present invention, the control circuit receives the first input signal and the second input signal, and generate the first control signal and the second control signal. The oscillator circuit generates the first oscillating signal and the second oscillating signal according to the first control signal and the second control signal. Therefore, the oscillator circuit may simultaneously output two oscillating signals with the same frequency or different frequencies by changing the magnitude of the input signal, so that there is no need to worry about the usage restrictions of the input signal, and there is also no need implement any monitoring circuit or prevention mechanism for the input signal.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
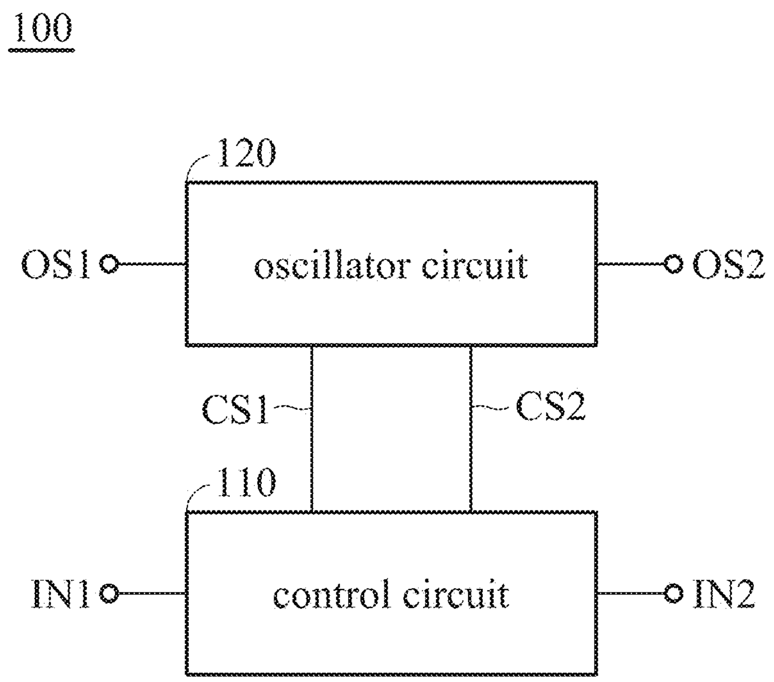
FIG. 1 is a schematic view of an oscillator device according to an embodiment of the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It should be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It should be acknowledged that although the terms "first", "second", "third", and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word “comprise” and variations such as “comprises” or “comprising”, will be acknowledged to imply the inclusion of stated elements but not the exclusion of any other elements.

In each of the following embodiments, the same reference number represents an element or component that is the same or similar.

FIG. 1 is a schematic view of an oscillator device according to an embodiment of the present invention. In the embodiment, the oscillator device 100 is, for example, a voltage-controlled oscillator (VCO), but the embodiment of the present invention is not limited thereto. Please refer to FIG. 1. The oscillator device 100 may include a control circuit 110 and an oscillator circuit 120.

The control circuit 110 may receive an input signal IN1 and an input signal IN2, and generate a control signal CS1 and a control signal CS2. That is, the control circuit 110 may generate the control signal CS1 and the control signal CS2 according to the input signal IN1 and the input signal IN2.

The oscillator circuit 120 is coupled to the control circuit 110. The oscillator circuit 120 may receive the control signal CS1 and the control signal CS2, and generate an oscillating signal OS1 and an oscillating signal OS2 according to the control signal CS1 and the control signal CS2.

In some embodiments, when the input signal IN1 and the input signal IN2 received by the control circuit 110 are the same, a frequency of the oscillating signal OS1 and a frequency of the oscillating signal OS2 generated by the oscillator circuit 120 may be the same.

In some embodiments, when the input signal IN1 and the input signal IN2 received by the control circuit 110 are different, a frequency of the oscillating signal OS1 and a frequency of the oscillating signal OS2 generated by the oscillator circuit 120 may be different. For example, when the input signal IN1 is higher than the input signal IN2, the frequency of the oscillating signal OS1 may be higher than the frequency of the oscillating signal OS2. When the input signal IN1 is lower than the input signal IN2, the frequency of the oscillating signal OS1 may be lower than the frequency of the oscillating signal OS2.

In some embodiments, the input signal IN2 may be used as an input reference signal of the oscillator device 100, and the input signal IN1 may be used to control the frequencies of the oscillation signal OS1 and the oscillation signal OS2 output by the oscillator device, but the embodiment of the present invention is not limited thereto.

Figure 2:
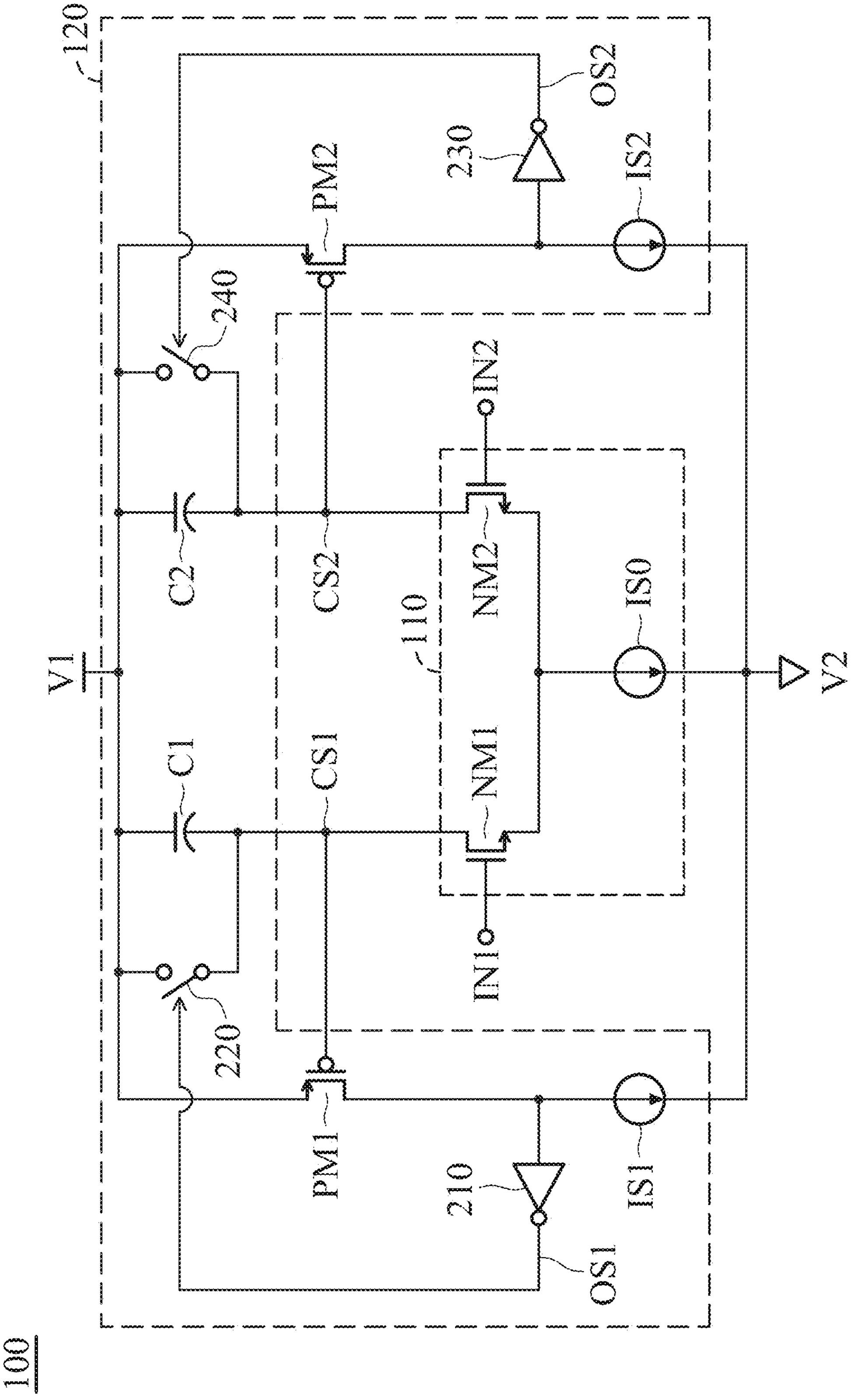
FIG. 2 is a schematic view of a detailed circuit of the oscillator device in FIG. 1.

FIG. 2 is a schematic view of a detailed circuit of the oscillator device in FIG. 1. Please refer to FIG. 2. The control circuit 110 may include a transistor NM1, a transistor NM2 and a current source IS0. In the embodiment, the transistor NM1 and the transistor NM2 may form a differential pair input terminal, and the input signal IN1 and the input signal IN2 may be a differential pair input signal.

The transistor NM1 may have a first terminal, a second terminal and a control terminal. The first terminal of the transistor NM1 may generate the control signal CS1. The control terminal of the transistor NM1 may receive the input signal IN1. Furthermore, the transistor NM1 may be controlled by the input signal IN1, and the transistor NM1 may be turned on or turned off according to the input signal IN1. For example, when the input signal IN1 is a high voltage level, the transistor NM1 may be turned on. When the input signal IN1 is a low voltage level, the transistor NM1 may be turned off.

The transistor NM2 may have a first terminal, a second terminal and a control terminal. the first terminal of the transistor NM2 may generate the control signal CS2. The second terminal of the transistor NM2 may be coupled to the second terminal of the transistor NM1. The control terminal of the transistor NM2 may receive the input signal IN2. Furthermore, the transistor NM2 may be controlled by the input signal IN2, and the transistor NM2 may be turned on or turned off according to the input signal IN2. For example, when the input signal IN2 is a high voltage level, the transistor NM2 may be turned on. When the input signal IN2 is a low voltage level, the transistor NM2 may be turned off.

The current source IS0 may have a first terminal and a second terminal. The first terminal of the current source IS0 may be coupled to the second terminal of the transistor NM1. The second terminal of the current source IS0 may be coupled to a reference voltage V2. In some embodiments, the above reference voltage V2 may be a low voltage level voltage, such as a ground voltage, but the embodiment of the present invention is not limited thereto.

In some embodiments, each of the transistor NM1 and the transistor NM2 may be an N-type transistor, wherein the first terminal of each of the transistor NM1 and the transistor NM2 may be a drain terminal of the N-type transistor, the second terminal of each of the transistor NM1 and the transistor NM2 may be a source terminal of the N-type transistor, and the control terminal of each of the transistor NM1 and the transistor NM2 may be a gate terminal of the N-type transistor, but the embodiment of the present invention is not limited thereto. In other embodiments, each of the transistor NM1 and the transistor NM2 may be a P-type transistor or another suitable transistor.

The oscillator circuit 120 may include a transistor PM1, a capacitor C1, a current source IS1, an inverter 210, a switching unit 220, a transistor PM2, a capacitor C2, a current source IS2, an inverter 230 and a switching unit 240.

The transistor PM1 may have a first terminal, a second terminal and a control terminal. The second terminal of the transistor PM1 may be coupled to a reference voltage V1. The control terminal of the transistor PM1 may receive the control signal CS1. Furthermore, the transistor PM1 may be controlled according to the control signal CS1, and the transistor PM1 may be turned on or turned off according to the control signal CS1. For example, when the control signal CS1 is a low voltage level, the transistor PM1 may be turned on. When the control signal CS1 is a high voltage level, the transistor PM1 may be turned off.

The capacitor C1 may have a first terminal and a second terminal. The first terminal of the capacitor C1 may be coupled to the control terminal of the transistor PM1. The second terminal of the capacitor C1 may be coupled to the reference voltage V1.

The current source IS1 may have a first terminal and a second terminal. The first terminal of the current source IS1 may be coupled to the first terminal of the transistor PM1. The second terminal of the current source IS1 may be coupled to a reference voltage V2.

The inverter 210 may have an input terminal and an output terminal. The input terminal of the inverter 210 may be coupled to the first terminal of the transistor PM1. The output terminal of the inverter 210 may generate the oscillating signal OS1.

The switching unit 220 may have a first terminal, a second terminal and a control terminal. The first terminal of the switching unit 220 may be coupled to the first terminal of the capacitor C1. The second terminal of the switching unit 220 may be coupled to the second terminal of the capacitor C1. The control terminal of the switching unit 220 may be coupled to the output terminal of the inverter 210 and may receive the oscillating signal OS1. Furthermore, the switching unit 220 may be controlled by the oscillating signal OS1, and the switching unit 220 may be turned on or turned off according to the oscillating signal OS1. For example, when the oscillating signal OS1 is a low voltage level, the switching unit 220 may be turned on. When the oscillating signal OS1 is a high voltage level, the switching unit 220 may be turned off.

The transistor PM2 may have a first terminal, a second terminal and a control terminal. The second terminal of the transistor PM2 may be coupled to the reference voltage V1. The control terminal of the transistor PM2 may receive the control signal CS2. Furthermore, the transistor PM2 may be controlled according to the control signal CS2, and the transistor may be turned on or turned off according to the control signal CS2. For example, when the control signal CS2 is a low voltage level, the transistor PM2 may be turned on. When the control signal CS2 is a high voltage level, the transistor PM2 may be turned off.

The capacitor C2 may have a first terminal and a second terminal. The first terminal of the capacitor C2 may be coupled to the control terminal of the transistor PM2. The second terminal of the capacitor C2 may be coupled to the reference voltage V1.

The current source IS2 may have a first terminal and a second terminal. The first terminal of the current source IS2 may be coupled to the first terminal of the transistor PM2. The second terminal of the current source IS2 may be coupled to the reference voltage V2.

The inverter 230 may have an input terminal and an output terminal. The input terminal of the inverter 230 may be coupled to the first terminal of the transistor PM2. The output terminal of the inverter 230 may generate the oscillating signal OS2.

The switching unit 240 may have a first terminal, a second terminal and a control terminal. The first terminal of the switching unit 240 may be coupled to the first terminal of the capacitor C2. The second terminal of the switching unit 240 may be coupled to the second terminal of the capacitor C2. The control terminal of the switching unit 240 may be coupled to the output terminal of the inverter 230 and may receive the oscillating signal OS2. Furthermore, the switching unit 240 may be controlled by the oscillating signal OS2, and the switching unit 240 may be turned on or turned off according to the oscillating signal OS2. For example, when the oscillating signal OS2 is a low voltage level, the switching unit 240 may be turned on. When the oscillating signal OS2 is a high voltage level, the switching unit 240 may be turned off.

In some embodiments, each of the transistor PM1 and the transistor PM2 may be a P-type transistor, wherein the first terminal of each of the transistor PM1 and the transistor PM2 may be a drain terminal of the P-type transistor, the second terminal of each of the transistor PM1 and the transistor PM2 may be a source terminal of the P-type transistor, and the control terminal of each of the transistor PM1 and the transistor PM2 may be a gate terminal of the P-type transistor, but the embodiment of the present invention is not limited thereto. In some embodiments, each of the transistor PM1 and the transistor PM2 may be an N-type transistor or another suitable transistor.

In some embodiments, each of the switching unit 220 and the switching unit 240 may be a P-type transistor, wherein the first terminal of each of the switching unit 220 and the switching unit 240 may be a drain terminal of the P-type transistor, the second terminal of each of the switching unit 220 and the switching unit 240 may be a source terminal of the P-type transistor, and the control terminal of each of the transistor 220 and the transistor 240 may be a gate terminal of P-type transistor, but the embodiment of the present invention is not limited thereto. In other embodiments, each of the switching unit 220 and the switching unit 240 may be an N-type transistor or another suitable transistor.

In some embodiment, the reference voltage V1 and the second reference voltage V2 may be different. Furthermore, the reference voltage V1 may be a high voltage level voltage, such as a system voltage, and the reference voltage V2 may be a low voltage level voltage, such as a ground voltage, but the embodiment of the present invention is not limited thereto.

In an entire operation of the oscillator device 100, first, when the input signal IN1 and the input signal IN2 are the low voltage level, the transistor NM1 and the transistor NM2 may be turned off. In addition, the voltages of the input terminal of the inverter 210 and the input terminal of the inverter 230 are preset to a low voltage level, so that the switching unit 220 and the switching unit 240 are turned on, and the control signal CS1 and the control signal CS2 are coupled to the reference voltage V1 (such as the high voltage level voltage), i.e., the control signal CS1 and the control signal CS2 equal to the reference voltage V1 (such as the high voltage level voltage).

When the control signal CS1 and the control signal CS2 are coupled to the reference voltage V1 (such as the high voltage level voltage), the transistor PM1 and the transistor PM2 are turned off, so that the voltages of the input terminal inverter 210 and the input terminal of the inverter 230 are the low voltage level. When the voltage of the input terminal of the inverter 210 and the voltage of the input terminal of the inverter 230 are the low voltage level, the output terminal of the inverter 210 may generate, for example, the oscillating signal OS1 with the high voltage level and the output terminal of the inverter 230 may generate, for example, the oscillating signal OS2 with the high voltage level. Then, when the oscillating signal OS1 and the oscillating signal OS2 are the high voltage level, the switching unit 220 and the switching unit 240 are turned off.

Afterward, when the input signal IN1 and the input signal IN2 are the high voltage level, the transistor NM1 and the transistor NM2 may be turned on, and the current source IS0 may start to discharge the capacitor C1 and the capacitor C2, so that the voltages of the control signal CS1 and the control signal CS2 are dropped.

Then, when the voltage of the control signal CS1 is lower than the turn-on voltage of the transistor PM1 (for example, the reference voltage V1 minus the threshold voltage of the transistor PM1 (i.e., $V1-Vth\_PM1$)) and the voltage of the control signal CS2 is lower than the turn-on voltage of the transistor PM2 (for example, the reference voltage V1 minus the threshold voltage of the transistor PM2 (i.e., $V1-Vth\_PM2$), the transistor PM1 and the transistor PM2 may be turned on and start outputting the current.

Afterward, when the output current of the transistor PM1 is greater than the current of the current source IS1 and the output current of the transistor PM2 is greater than the current of the current source IS2, the voltage of the input terminal of the inverter 210 is, for example, the high voltage level and the voltage of the input terminal of the inverter 230 is, for example, the high voltage level, so that the output terminal of the inverter 210 generates, for example, the oscillating signal OS1 with the low voltage level and the output terminal of the inverter 230 generates, for example, the oscillating signal OS2 with the low voltage level.

Then, when the oscillating signal OS1 and the oscillating signal OS2 is the low voltage level, the switching unit 220 and the switching unit 240 are turned on, so that the voltages of the control signal CS1 and the control signal CS2 are again pulled to the reference voltage V1 (such as the high voltage level voltage), i.e., the control signal CS1 and the control signal CS2 are reset to the reference voltage V1 (such as the high voltage level).

Afterward, when the voltages of the control signal CS1 and the control signal CS2 are again pulled to the reference voltage V1 (such as the high voltage level), the transistor PM1 and the transistor PM2 are turned off, so that the voltage of the input terminal of the inverter 210 and the voltage of the input terminal of the inverter 230 are a low voltage level. When the voltage of the input terminal of the inverter 210 and the voltage of the input terminal of the inverter 230 are the low voltage level, the oscillating signal OS1 generated by the output terminal of the inverter 210 and the oscillating signal OS2 generated by the output terminal of the inverter 230 may also be pulled to a high voltage level, so that the oscillating signal OS1 and the oscillating signal OS2 of the oscillator device 100 complete a pulse output.

Then, by repeating the above operations, the oscillating signal OS1 and the oscillating signal OS2 may output corresponding periodic signals. Furthermore, in some embodiments, when the input signal IN1 and the input signal IN2 are the same (i.e., the voltage of the input signal IN1 and the voltage of the input signal IN2 is the same), the current of current source IS0 may be evenly distributed and start to discharge capacitor C1 and capacitor C2. Therefore, the period of the output of the oscillating signal OS1 is the same as the period of the output of the oscillating signal OS2, i.e., the frequency of the oscillating signal OS1 may be the same as the frequency of the oscillating signal OS2.

When the input signal IN1 is higher than the input signal IN2 (i.e., the voltage of the input signal IN1 is higher than the voltage of the input signal IN2, the current for discharging the capacitor C1 may be greater than the current for discharging the capacitor C2. Therefore, the period of the output of the oscillating signal OS1 may be shorter than the period of the output of the oscillating signal OS2, i.e., the frequency of the oscillating signal OS1 may be higher than the frequency of the oscillating signal OS2.

On the contrary, when the input signal IN1 is lower than the input signal IN2 (i.e., the voltage of the input signal IN1 is lower than the voltage of the input signal IN2), the current for discharging the capacitor C1 may be smaller than the current for discharging the capacitor C2. Therefore, the period of the output of the oscillating signal OS1 may longer than the period of output of the oscillating signal S2, i.e., the frequency of the oscillating signal OS1 may be lower than the frequency of the oscillating signal OS2.

Figure 3:
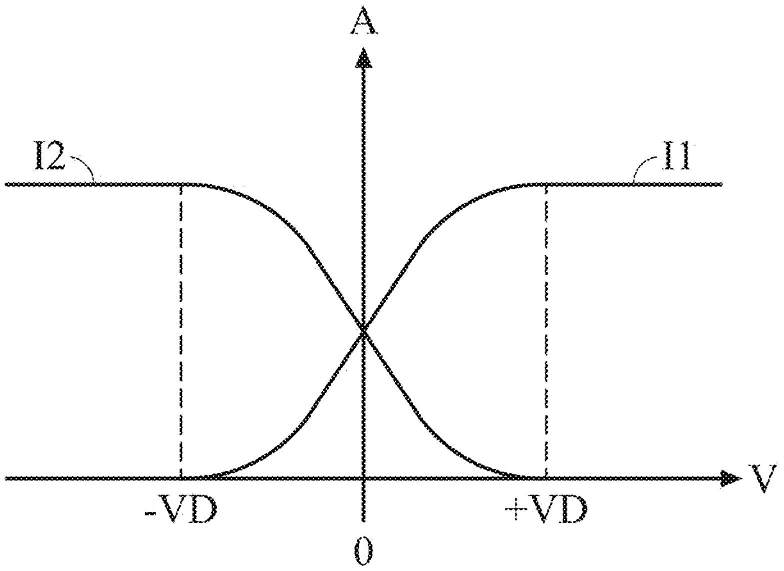
FIG. 3 is a schematic view of a corresponding relationship of a voltage difference between an input signal IN1 and an input signal IN2, a current flowing through a transistor NM1 and a current flowing through a transistor NM2 according to an embodiment of the present invention.

FIG. 3 is a schematic view of a corresponding relationship of a voltage difference between an input signal IN1 and an input signal IN2, a current flowing through a transistor NM1 and a current flowing through a transistor NM2 according to an embodiment of the present invention.

In FIG. 3, the reference number "I1" represents a current flowing through the transistor NM1, the reference number "I2" represents a current flowing through the transistor NM2, "+VD" represent a maximum voltage difference between the input signal IN1 and the input signal IN2 when the input signal IN1 is higher than the input signal IN2, and "−VD" represent a maximum voltage difference between the input signal IN1 and the input signal IN2 when the input signal IN1 is lower than the input signal IN2.

It can be seen from FIG. 3 that when the input signal IN1 and the input signal IN2 are the same, the voltage difference between the input signal IN1 and the input signal IN2 is 0. At this time, the current of the current source IS0 is approximately equal to the current I1 flowing through the transistor NM1 (i.e., ½ of the maximum value of the current I1) or the current I2 flowing through the transistor NM2 (i.e., ½ of the maximum value of the current I2).

When the input signal IN1 is higher than the input signal IN2 and the voltage difference between the input signal IN1 and the input signal IN2 reaches or exceeds the maximum voltage difference +VD, the current of the current source IS0 may be almost completely equal to the current I1 flowing through the transistor NM1 (i.e., the maximum value of the current I1). At this time, the frequency of the oscillating signal OS1 is the highest output frequency of the oscillator device 100, and the frequency of the oscillating signal OS1 is almost twice that of the oscillating signal OS1 when the input signal IN1 and the input signal IN2 are the same. In addition, the frequency of the oscillating signal OS2 is the lowest output frequency of the oscillator device 100.

On the contrary, when the input signal IN1 is lower than the input signal IN2 and the voltage difference between the input signal IN1 and the input signal IN2 reaches or exceeds the maximum voltage difference-VD, the current of the current source IS0 may be almost completely equal to the current I2 flowing through the transistor NM2 (i.e., the maximum value of the current I2). At this time, the frequency of the oscillating signal OS2 is the highest output frequency of the oscillator device 100, and the frequency of the oscillating signal OS2 is almost twice that of the oscillating signal OS2 when the input signal IN1 and the input signal IN2 are the same. In addition, the frequency of the oscillating signal OS1 is the lowest output frequency of the oscillator device 100.

In addition, since the oscillator device 100 uses a differential pair input design, even if the voltage of the input signal IN1 is zero, it may not affect the operation of the oscillator device 100. Therefore, there is no need to worry that the voltage of the input signal IN1 is too low to affect the accuracy of the output of the oscillator device, and there is also no need implement any monitoring circuit or prevention mechanism for the input signal IN1.

In summary, according to the oscillator device disclosed by the embodiment of the present invention, the control circuit receive the first input signal and the second input signal and generates the first control signal and the second control signal. The oscillator circuit generates the first oscillating signal and the second oscillating signal according to the first control signal and the second control signal. Therefore, the oscillator circuit may output two oscillating signals with the same frequency or different frequencies by changing the magnitude of the input signal, so that there is no need to worry about the usage restrictions of the input signal, and there is also no need implement any monitoring circuit or prevention mechanism for the input signal.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An oscillator device, comprising:

a control circuit, configured to receive a first input signal and a second input signal, and generate a first control signal and a second control signal; and an oscillator circuit, coupled to the control circuit, and configured to receive the first control signal, the second control signal, a first reference voltage and a second reference voltage, and generate a first oscillating signal and a second oscillating signal according to the first control signal, the second control signal, the first reference voltage and the second reference voltage, wherein the first reference voltage and the second reference voltage are different;

wherein the control circuit comprises:

a first transistor, having a first terminal, a second terminal and a control terminal, wherein the first terminal of the first transistor is configured to generate the first control signal, and the control terminal of the first transistor is configured to receive the first input signal;

a second transistor, having a first terminal, a second terminal and a control terminal, wherein the first terminal of the second transistor is configured to generate the second control signal, the second terminal of the second transistor is coupled to the second terminal of the first transistor, and the control terminal of the second transistor is configured to receive the second input signal; and a first current source, having a first terminal and a second terminal, wherein the first terminal of the first current source is coupled to the second terminal of the first transistor, and the second terminal of the first current source is coupled to the second reference voltage.

2. The oscillator device as claimed in claim 1, wherein when the first input signal and the second input signal are the same, a frequency of the first oscillating signal and a frequency of the second oscillating signal are the same.

3. The oscillator device as claimed in claim 1, wherein when the first input signal and the second input signal are different, a frequency of the first oscillating signal and a frequency of the second oscillating signal are different.

4. The oscillator device as claimed in claim 3, wherein when the first input signal is higher than the second input signal, the frequency of the first oscillating signal is higher than the frequency of the second oscillating signal.

5. The oscillator device as claimed in claim 3, wherein when the first input signal is lower than the second input signal, the frequency of the first oscillating signal is lower than the frequency of the second oscillating signal.

6. The oscillator device as claimed in claim 1, wherein the second reference voltage is a low voltage level voltage.

7. The oscillator device as claimed in claim 1, wherein each of the first transistor and the second transistor is an N-type transistor.

8. The oscillator device as claimed in claim 1, wherein the oscillator circuit comprises:

a third transistor, having a first terminal, a second terminal and a control terminal, wherein the second terminal of the third transistor is coupled to the first reference voltage, and the control terminal of the third transistor is configured to receive the first control signal;

a first capacitor, having a first terminal and a second terminal, wherein the first terminal of the first capacitor is coupled to the control terminal of the third transistor, and the second terminal of the first capacitor is coupled to the first reference voltage;

a second current source, having a first terminal and a second terminal, wherein the first terminal of the second current source is coupled to the first terminal of the third transistor, and the second terminal of the second current source is coupled to the second reference voltage;

a first inverter, having an input terminal and an output terminal, wherein the input terminal of the first inverter is coupled to the first terminal of the third transistor, and the output terminal of the first inverter is configured to generate the first oscillating signal;

a first switching unit, having a first terminal, a second terminal and a control terminal, wherein the first terminal of the first switching unit is coupled to the first terminal of the first capacitor, the second terminal of the first switching unit is coupled to the second terminal of the first capacitor, and the control terminal of the first switching unit is coupled to the output terminal of the first inverter and configured to receive the first oscillating signal;

a fourth transistor, having a first terminal, a second terminal and a control terminal, wherein the second terminal of the second terminal of the fourth transistor is coupled to the first reference voltage, and the control terminal of the fourth transistor is configured to receive the second control signal;

a second capacitor, having a first terminal and a second terminal, wherein the first terminal of the second capacitor is coupled to the control terminal of the fourth transistor, and the second terminal of the second capacitor is coupled to the first reference voltage;

a third current source, having a first terminal and a second terminal, wherein the first terminal of the third current source is coupled to the first terminal of the fourth transistor, and the second terminal of the third current source is coupled to the second reference voltage;

a second inverter, having an input terminal and an output terminal, wherein the input terminal of the second inverter is coupled to the first terminal of the fourth transistor, and the output terminal of the second inverter is configured to generate the second oscillating signal; and a second switching unit, having a first terminal, a second terminal and a control terminal, wherein the first terminal of the second switching unit is coupled to the first terminal of the second capacitor, the second terminal of the second switching unit is coupled to the second terminal of the second capacitor, and the control terminal of the second switching unit is coupled to the output terminal of the second inverter and configured to receive the second oscillating signal.

9. The oscillator device as claimed in claim 8, wherein each of the third transistor and the fourth transistor is a P-type transistor.

10. The oscillator device as claimed in claim 8, wherein the first reference voltage is a high voltage level voltage, and the second reference voltage is a low voltage level voltage.

* * * * *